US012660662B2

(12) United States Patent
Darmawikarta et al.

(10) Patent No.: US 12,660,662 B2
(45) Date of Patent: Jun. 16, 2026

(54) METHODS AND APPARATUS TO ADHERE A DIELECTRIC TO A NONCONDUCTIVE LAYER IN CIRCUIT DEVICES

(71) Applicant: Intel Corporation, Santa Clara, CA (US)

(72) Inventors: Kristof Darmawikarta, Chandler, AZ (US); Srinivas Pietambaram, Chandler, AZ (US); Benjamin Duong, Phoenix, AZ (US); Haobo Chen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 17/855,298

(22) Filed: Jun. 30, 2022

(65) Prior Publication Data

US 2024/0006284 A1    Jan. 4, 2024

(51) Int. Cl.
| | |
|---|---|
| *H01L 23/498* | (2006.01) |
| *H10W 70/05* | (2026.01) |
| *H10W 70/60* | (2026.01) |
| *H10W 70/65* | (2026.01) |
| *H10W 70/685* | (2026.01) |
| *H10W 70/69* | (2026.01) |
| *H10W 90/00* | (2026.01) |

(52) U.S. Cl.
CPC ......... *H10W 70/685* (2026.01); *H10W 70/05* (2026.01); *H10W 70/611* (2026.01); *H10W 70/65* (2026.01); *H10W 70/69* (2026.01); *H10W 90/401* (2026.01); *H10W 90/00* (2026.01); *H10W 90/701* (2026.01); *H10W 90/724* (2026.01)

(58) Field of Classification Search
None
See application file for complete search history.

(56) References Cited

U.S. PATENT DOCUMENTS 10,199,266 B2 *    2/2019   Jaywant .............. H01L 23/5329

* cited by examiner

*Primary Examiner* — Long Pham
(74) *Attorney, Agent, or Firm* — Hanley, Flight & Zimmerman, LLC

(57) ABSTRACT

Methods, apparatus, systems, and articles of manufacture are disclosed that adhere a dielectric to a nonconductive layer in circuit devices. An example apparatus includes an electrically conductive layer, a dielectric layer, and an electrically nonconductive layer separating the dielectric layer from the conductive layer, the nonconductive layer having a first surface facing the conductive layer and a second surface facing the dielectric layer, the first surface having a first roughness, the second surface having a second roughness greater than the first roughness.

16 Claims, 14 Drawing Sheets

300

START

302 — PROVIDE SUBSTRATE

304 — DEPOSIT CONDUCTIVE LAYER ONTO SUBSTRATE

306 — DEPOSIT NONCONDUCTIVE ADHESION LAYER ONTO THE CONDUCTIVE LAYER

308 — ROUGHEN EXPOSED SURFACE OF NONCONDUCTIVE ADHESION LAYER

310 — ATTACH DIELECTRIC LAYER TO CONDUCTIVE LAYER VIA NONCONDUCTIVE ADHESION LAYER

312 — ADD ANOTHER CONDUCTIVE LAYER?

YES

NO

END

ROUGHEN EXPOSED SURFACE OF NONCONDUCTIVE
ADHESION LAYER

DEPOSIT METAL PARTICULATES ONTO A SURFACE OF
THE NONCONDUCTIVE ADHESION LAYER                    400

ETCH THE SURFACE OF THE NONCONDUCTIVE
ADHESION LAYER                                       402

REMOVE METAL PARTICULATES FROM THE SURFACE          404

RETURN

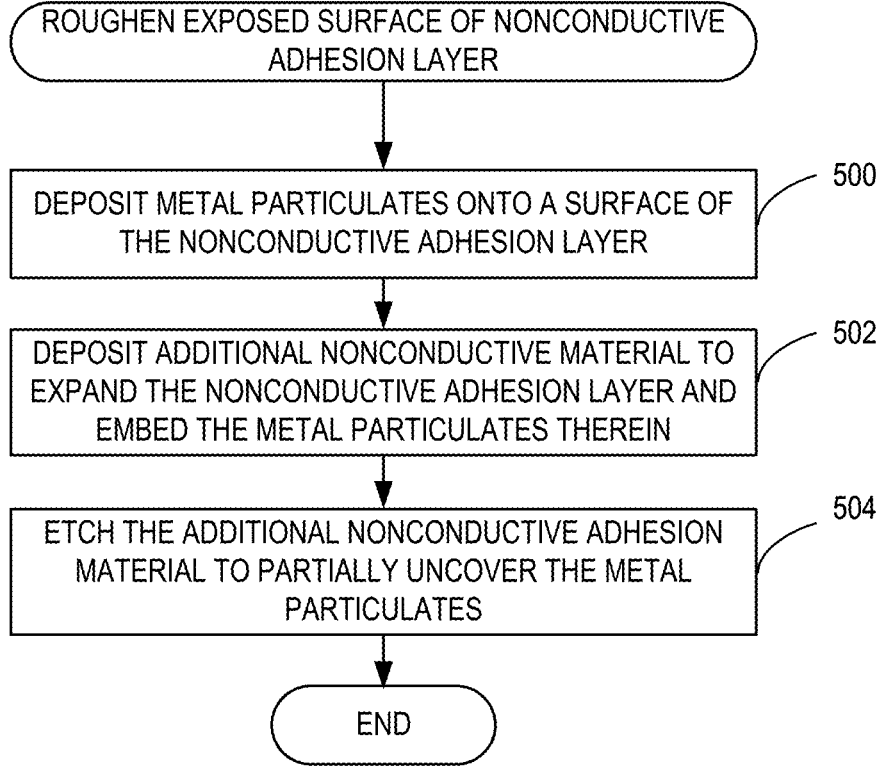

ROUGHEN EXPOSED SURFACE OF NONCONDUCTIVE
ADHESION LAYER

DEPOSIT METAL PARTICULATES ONTO A SURFACE OF
THE NONCONDUCTIVE ADHESION LAYER                    500

DEPOSIT ADDITIONAL NONCONDUCTIVE MATERIAL TO
EXPAND THE NONCONDUCTIVE ADHESION LAYER AND
EMBED THE METAL PARTICULATES THEREIN               502

ETCH THE ADDITIONAL NONCONDUCTIVE ADHESION
MATERIAL TO PARTIALLY UNCOVER THE METAL
PARTICULATES                                        504

END

FIG. 5

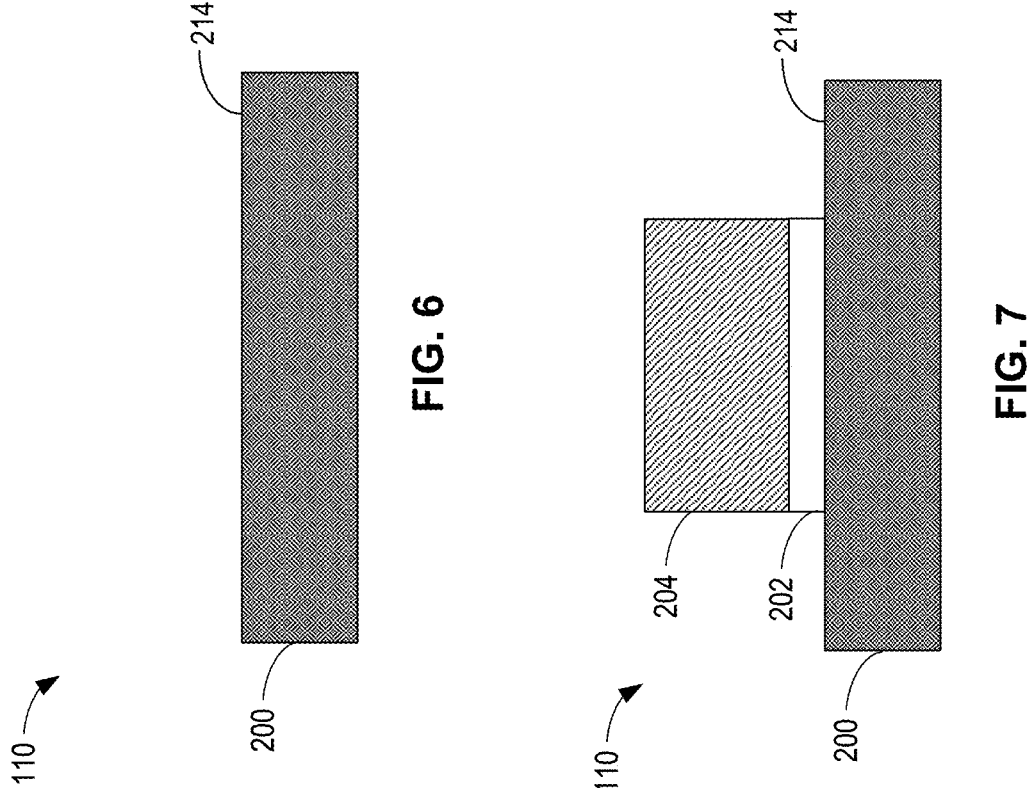

| 2000 | | |
|---|---|---|
| PROCESSING DEVICE 2002 | COMMUNICATION CHIP 2012 | |
| MEMORY 2004 | BATTERY/POWER 2014 | A N T E N N A 2022 |
| DISPLAY DEVICE 2006 | GPS DEVICE 2018 | |
| AUDIO OUTPUT DEVICE 2008 | AUDIO INPUT DEVICE 2024 | |
| OTHER OUTPUT DEVICE 2010 | OTHER INPUT DEVICE 2020 | |

METHODS AND APPARATUS TO ADHERE A DIELECTRIC TO A NONCONDUCTIVE LAYER IN CIRCUIT DEVICES

FIELD OF THE DISCLOSURE

This disclosure relates generally to electrical circuit devices and, more particularly, to methods and apparatus to adhere a dielectric to a nonconductive layer in circuit devices.

BACKGROUND

Many electrical circuit devices include substrates (e.g., integrated circuit (IC) package substrates, printed circuit boards (PCB), etc.) with conductive layers and nonconductive layers. Adhesion between such layers is often achieved by roughening the surface of a conductive layer (e.g., copper) prior to the addition of a nonconductive layer (e.g., dielectric). Adhesion between conductive layers and nonconductive layers can impact electrical performance and device reliability.

BRIEF DESCRIPTION OF THE DRAWINGS

FIGS. 3-5 are flowcharts representative of example methods to produce the example substrate of FIGS. 1 and 2.

FIGS. 6-11 depict the example substrate of FIGS. 1 and 2 at various manufacturing stages corresponding to the example methods of FIGS. 3 and 4.

Figure 1:
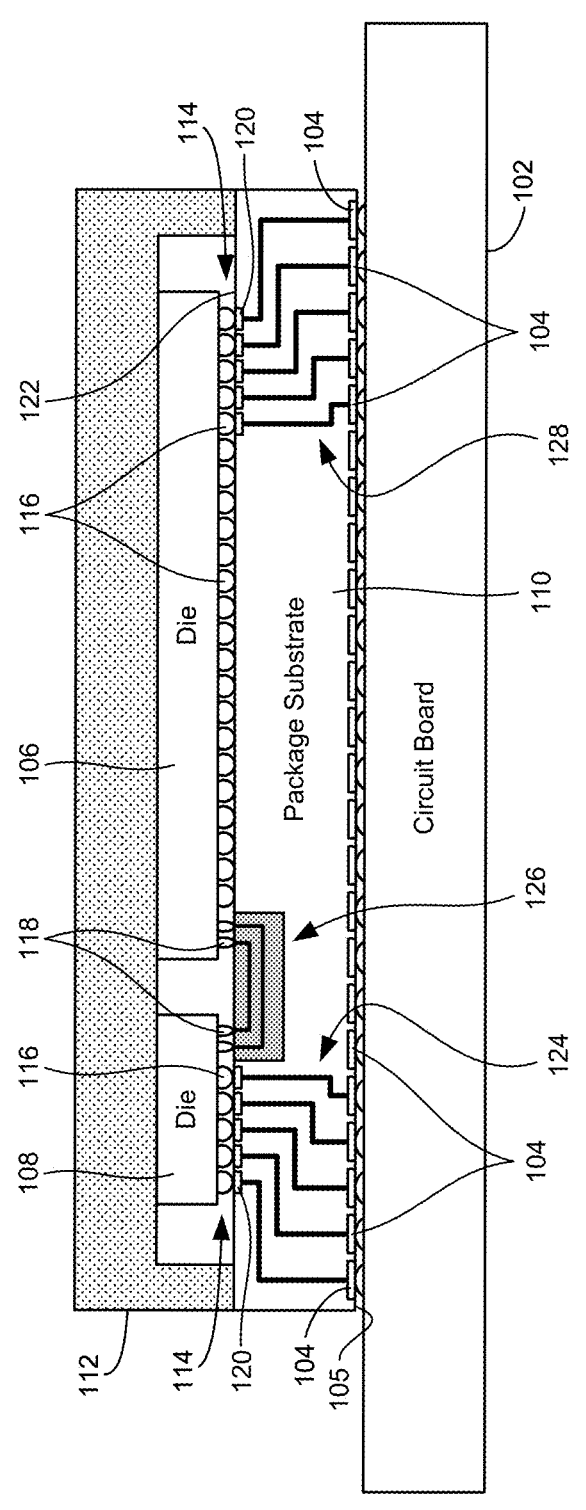
FIG. 1 illustrates an example integrated circuit (IC) package constructed in accordance with teachings disclosed herein.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

Semiconductor devices utilize nonconductive layers (e.g., dielectric layers) for electrical isolation and/or protection from conductive layers (e.g., metal trace, copper layer, etc.). At high frequencies, the current travels predominantly at the surface (e.g., skin) of the conductive layer. This skin effect limits current flow to the surface of the conductor and reduces current flow deeper within the conductor, thereby increasing the resistivity of the circuit. Thus, the skin effect of a conductor can degrade the electrical performance of the device. Further, nonconductive dielectric materials can negatively impact electrical performance (e.g., dielectric loss) depending on the material properties (e.g., resistivity) of the dielectric materials.

Delamination (e.g., cracking or separating) of conductive and nonconductive layers can reduce the electrical isolation in the device, and, thus, can negatively affect the device reliability. To that end, improved adhesion between these layers is needed to satisfy the increasing demand for high performing semiconductor devices. Typically, the surface of the conductive layer is roughened to increase the surface area, thereby increasing the adhesion strength (e.g., anchor) to the subsequent dielectric layer. However, a rough conductive surface increases the resistivity of the circuit due to the skin effect. Thus, roughening a conductive surface can degrade the electrical performance of a semiconductor device.

One approach to adhere a dielectric to a conductive layer is to utilize another nonconductive layer (e.g., organic and/or nonorganic thin film adhesion layer) to promote chemical adhesion between the dielectric and the conductor. Silicon nitride (SiNx) layers are one example of an adhesion promoting layer. Although SiNx provides relatively strong adhesion to copper, there is still a risk of the dielectric layer delaminating from the SiNx layer.

Examples disclosed herein provide an improved technique to adhere (e.g., bond) a conductive layer (e.g., copper) to a dielectric layer through the use of an intermediary nonconductive adhesion layer (e.g., an adhesion promoting layer). Examples disclosed herein utilize an intermediary nonconductive adhesion layer for improved electrical isolation in semiconductor devices. Further, the use of an intermediary nonconductive adhesion layer in disclosed examples enable smooth (non-roughened) surfaces on the underlying conductive layer for improved electrical performance. Examples disclosed herein reduce the adverse effects of delamination between nonconductive and conductive layers in semiconductor devices. Examples disclosed herein utilize surface roughening techniques for improved adhesion between nonconductive layers of an electronic circuit device (e.g., between an intermediary nonconductive adhesion layer and a subsequently added dielectric layer).

FIG. 1 illustrates an example integrated circuit (IC) package 100 constructed in accordance with teachings disclosed herein. In the illustrated example, the IC package 100 is electrically coupled to a circuit board 102 via an array of contact pads or lands 104 on a mounting surface (e.g., a bottom surface) 105. In some examples, the IC package 100 may include balls, pins, and/or pads, in addition to or instead of the contact pads 104, to enable the electrical coupling of the package 100 to the circuit board 102. In this example, the package 100 includes two semiconductor (e.g., silicon) dies 106, 108 (sometimes also referred to as chips or chiplets) that are mounted to a package substrate 110 and enclosed by a package lid or mold compound 112. While the example IC package 100 of FIG. 1 includes two dies 106, 108, in other examples, the package 100 may have only one die or more than two dies. The dies 106, 108 can provide any suitable type of functionality (e.g., data processing, memory storage, etc.).

As shown in the illustrated example, each of the dies 106, 108 is electrically and mechanically coupled to the substrate 110 via corresponding arrays of interconnects (e.g., balls, bumps, wire bonding, etc.) 114. The electrical connections between the dies 106, 108 and the substrate 110 (e.g., the interconnects 114) are sometimes referred to as first level interconnects. By contrast, the electrical connections between the IC package 100 and the circuit board 102 (e.g., the pads 104) are sometimes referred to as second level interconnects. In some examples, one or both of the dies 106, 108 may be stacked on top of one or more other dies and/or an interposer. In such examples, the dies 106, 108 are coupled to the underlying die and/or interposer through a first set of first level interconnects and the underlying die and/or interposer may be connected to the package substrate 110 via a separate set of first level interconnects associated with the underlying die and/or interposer. Thus, as used herein, first level interconnects refer to interconnects (e.g., balls, bumps, wire bonding, etc.) between a die and a package substrate or a die and an underlying die and/or interposer.

As shown in FIG. 1, the interconnects 114 of the first level interconnects include two different types of bumps corresponding to core bumps 116 and bridge bumps 118. As used herein, core bumps 116 refer to bumps of the dies 106, 108 through which electrical signals pass between the dies 106, 108 and components external to the IC package 100. More particularly, as shown in the illustrated example, when the dies 106, 108 are mounted to the package substrate 110, the core bumps 116 are physically connected and electrically coupled to contact pads 120 on an inner surface 122 of the substrate 110. The contact pads 120 on the inner surface 122 of the package substrate 110 are electrically coupled to the landing pads 104 on the bottom (external) surface 105 of the substrate 110 (e.g., a surface opposite the inner surface 122) via internal interconnects 124 within the substrate 110. As a result, there is a complete signal path between the bumps 114 of the dies 106, 108 and the landing pads 104 mounted to the circuit board 102 that pass through the contact pads 120 and the interconnects 124 provided therebetween.

As used herein, bridge bumps 118 refer to bumps on the dies 106, 108 through which electrical signals pass between different ones of the dies 106, 108 within the package 100. Thus, as shown in the illustrated example, the bridge bumps 118 of the first die 106 are electrically coupled to the bridge bumps 118 of the second die 108 via an interconnect bridge 126 embedded in the package substrate 110. As represented in FIG. 1, core bumps 116 are typically larger than bridge bumps 118. In some examples, the interconnect bridge 126 and the associated bridge bumps 118 are omitted.

Crosstalk between conductive layers of the example package substrate 110 can limit the bandwidth of data that can be transmitted through the IC package 100. More particularly, crosstalk is problematic for IC packages operating at high frequencies and/or high-speed input/output (HSIO). Delamination between conductive and nonconductive layers of the substrate 110 can also impede electrical performance of the IC package 100. Thus, adhesion between such layers in the substrate 110 can improve electrical isolation between conductive layers and improve signal bandwidth in the package 100. Some substrates include nonconductive adhesion layers (e.g., adhesion promotor layers) between the conductive layer and the dielectric layer to resolve crosstalk and/or delamination issues. However, delamination associated with nonconductive adhesion layers and interfacing dielectric layers can still result in significant degradation of electrical performance.

In the illustrated example of FIG. 1 and in accordance with teachings disclosed herein, the nonconductive adhesion layers undergo a surface roughening treatment to improve a bond with the adjacent dielectric layers. For example, such treatments may include at least one of selective dry etching, plasma etching, multi-target sputtering, etc. By utilizing a roughened surface of a nonconductive adhesion layer, examples disclosed herein reduce the adverse effects of delamination between nonconductive and conductive layers in the substrate 110, thereby improving the electrical performance of the IC package 100.

Figure 2:
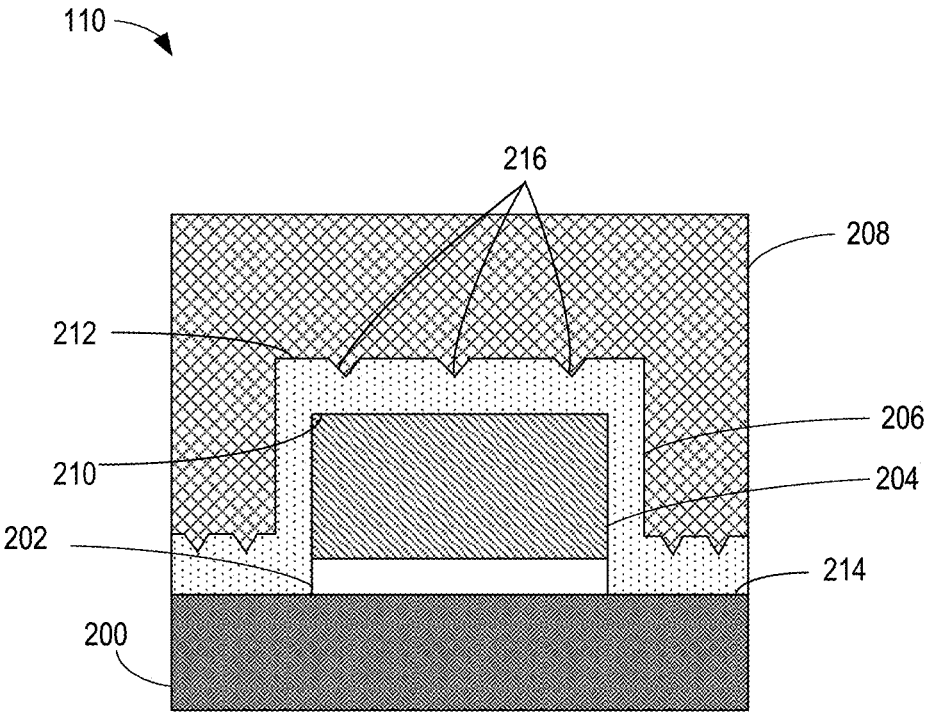
FIG. 2 is a cross-sectional view of an example implementation of the example substrate of FIG. 1.

FIG. 2 is a cross-sectional view of a portion of the example substrate 110 of FIG. 1. In the illustrated example of FIG. 2, the example substrate 110 includes multiple layers, some of which are conductive while others are nonconductive. More particularly, in this example, the layers include a substrate 200, a metal seed layer 202, a conductive layer 204, a nonconductive adhesion layer 206, and a dielectric layer (e.g., dielectric material) 208. The example substrate 200 is a core or a base (e.g., a portion) of the substrate 110 shown in FIG. 1. As such, build up layers can be added to the substrate 200 that include the metal seed layer 202, the conductive layer 204, the nonconductive adhesion layer 206, and the dielectric layer 208. In some examples, the buildup layer includes multiple alternating layers of conductive materials and dielectric layers. In some examples, build up layers are provided on either side of a core (e.g., the substrate 200) in the substrate 110. The substrate 200 and the dielectric layer 208 are positioned at opposite ends of the stack of layers with the nonconductive adhesion layer 206 adjacent to (e.g., in contact with) the dielectric layer 208, the metal seed layer 202 adjacent (e.g., in contact with) the substrate 200, and the conductive layer 204 between the metal seed layer 202 and the nonconductive adhesion layer 206. The metal seed layer 202 and the conductive layer (e.g., conductive trace) 204 are composed of an electrically conductive material. In some examples, the conductive material used for the metal seed layer 202 is the same as the conductive material used for the conductive layer 204. In some examples, the conductive material is copper. However, other materials may alternatively be used (e.g., gold, silver, platinum, etc.). In some examples, the metal seed layer 202 is omitted and the conductive layer 204 is directly adjacent (e.g., in contact with) the substrate 200. The dielectric layer 208 is composed of a nonconductive material (e.g., epoxy, glass, silicon, etc.).

The nonconductive adhesion layer 206 separates and adheres to both the conductive layer 204 and the dielectric layer 208. The nonconductive adhesion layer 206 includes a first surface 210 facing the conductive layer 204 and a second surface 212 facing the dielectric layer 208. In this example, the second surface 212 of the nonconductive adhesion layer 206 faces away from a surface 214 of the substrate 200 and the first surface 210 of the nonconductive adhesion layer 206 faces towards the surface 214. In some examples, the nonconductive adhesion layer 206 includes silicon (Si) and nitrogen (N) (e.g., silicon nitride (SiNx)).

The first surface 210 defines an interface between the nonconductive adhesion layer 206 and the underlying conductive layer 204 such that the nonconductive adhesion layer 206 is in contact with the conductive layer 204. The second surface 212 defines an interface between the nonconductive adhesion layer 206 and the dielectric layer 208 such that the nonconductive adhesion layer 206 is in contact with the dielectric layer 208. In the example of FIG. 2, the first surface 210 has a first surface roughness and the second surface 212 has a second surface roughness greater than the first surface roughness. In some examples, the first surface roughness is defined by and corresponds to the surface roughness of the underlying conductive layer 204. As described above, in some examples, the surface roughness of the conductive layer 204 is relatively smooth to reduce signal losses associated with the skin effect. As a result, the first surface roughness of the first surface 210 of the nonconductive adhesion layer 206 is correspondingly relatively smooth. By contrast, the second surface roughness (of the second surface 212 of the nonconductive adhesion layer 206 has a higher surface roughness to facilitate improved bonding with the dielectric layer 208.

As used herein, "surface roughness" (or simply "roughness" for short) refers to a peak-to-valley measurement associated with a surface. For example, the peak-to-valley measurement refers to the maximum depth of irregularities in a surface. For example, the second surface roughness can be over 75 nanometers (nm), wherein the distance from a bottom portion of the second surface 212 to a top portion of the second surface 212 is at least 75 nm. In some examples, the second surface roughness is significantly more than 75 nm in the range between 100 nm and 300 nm (e.g., over 100 nm, over 150 nm, over 200 nm, over 250 nm). In some examples, the first surface roughness can be less than 50 nm, wherein the distance from a bottom portion of the first surface 210 to a top portion of the first surface 210 is less than 50 nm. In some examples, the first surface roughness is significantly less than 50 nm in the range between 1 nm and 50 nm (e.g., less than 40 nm, less than 30 nm, less than 25 nm, less than 10 nm). In some examples, surface roughening techniques can increase the surface area of a surface (e.g., creating peaks and valleys). Thus, in the example of FIG. 2, the surface area of the second surface 212 has a surface area greater than the first surface 210 due to the second surface 212 having a greater surface roughness than the first surface 210. In the example of FIG. 2, the second roughness (on the second surface 212) is illustrated by recesses 216 in the second surface 212. The second roughness of the second surface 212 can be accomplished by one or more surface roughening techniques described in detail in connection with FIGS. 3-15.

In the illustrated example of FIG. 2, the second roughness of the second surface 212 enables the second surface 212 to adhere (e.g., chemically adhere, mechanically adhere, anchor, etc.) to the dielectric layer 208. In some examples, the roughened surface 212 can include metal particulates (e.g., metal bodies, dopants, etc.) at the interface between the nonconductive adhesion layer 206 and the dielectric layer 208. More particularly, in some examples, the metal particulates are located at or near the peaks in the peaks and valleys of the roughened surface because, as described in further detail below, the metal particulates serve as a mask during an etching process performed on the nonconductive adhesion layer 206 to produce the surface roughness of the surface 212. That is, the metal particulates protect the underlying regions of the nonconductive adhesion layer 206 from being etched such that these regions become the peaks or high points of the roughened surface while the regions surrounding the metal particulates are etched away to become the valleys or low points in the roughened surface. Thus, in the illustrated example of FIG. 2, the recesses 216 correspond to regions of the surface 212 that were unprotected by (e.g., spaced apart from or positioned between) the metal particulates. No metal particulates are shown in the illustrated example of FIG. 2 because, in some examples, the metal particulates are removed prior to adding the dielectric layer 208. In other examples, some or all of the metal particulates are retained on the surface 212. In some examples, the metal particulates can be irregularly and/or randomly distributed across the surface 212. In some examples, the metal particulates are embedded in the nonconductive adhesion layer 206. Further, the metal particulates can be closer to the surface 212 than to the surface 210. Further, the example metal particulates are composed of any suitable material that will reduce (e.g., prevent) the etching of the underlying regions of the nonconductive adhesion layer 206 during an etching process. For example, the metal particulates can include at least one of titanium or magnesium.

Figure 3:
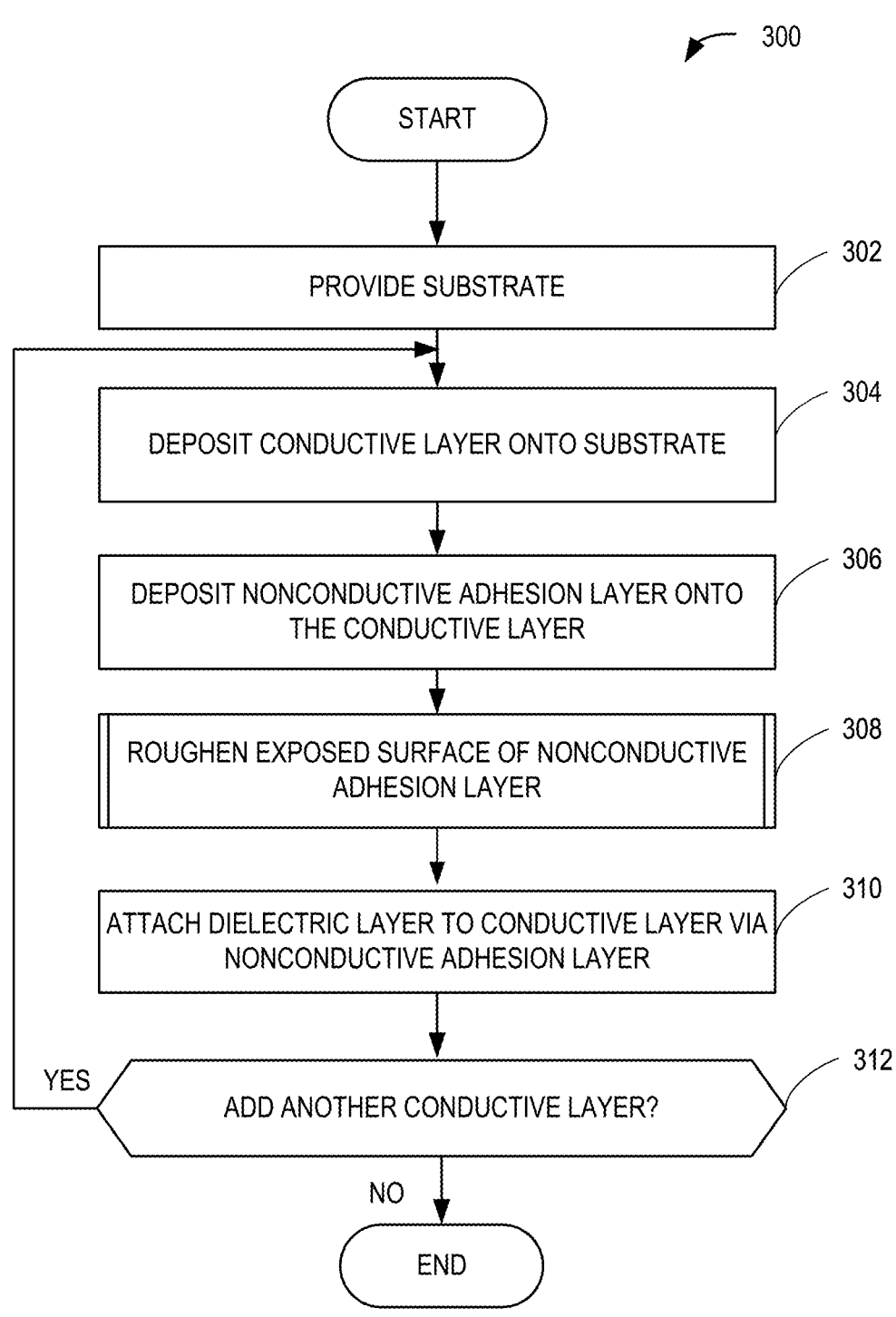
Figure 4:
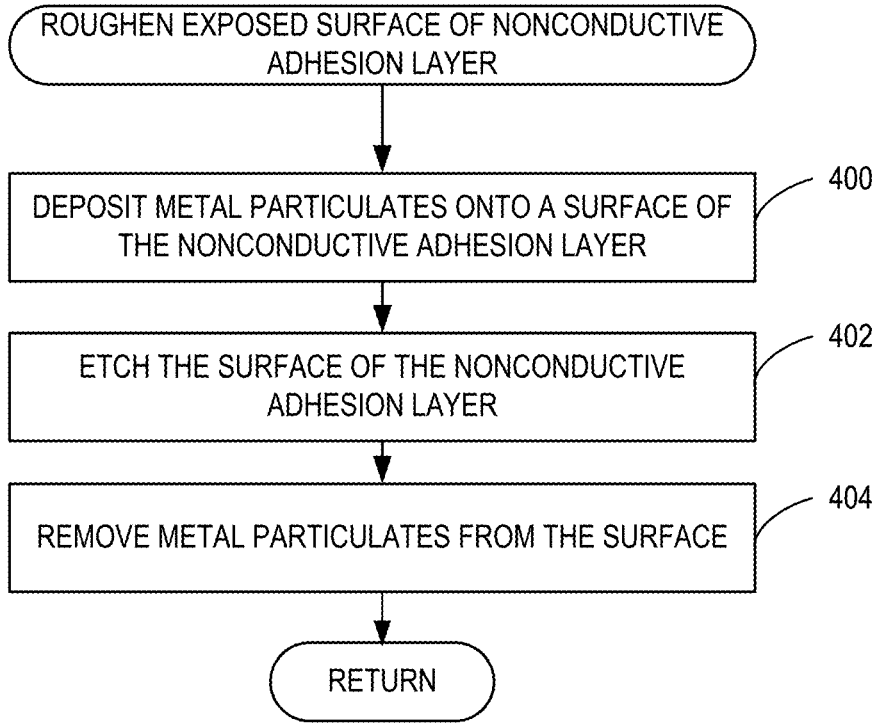

FIGS. 3-5 are flowcharts representative of example methods to produce the example substrate 110 of FIGS. 1 and 2. FIGS. 6-14 represent the example substrate 110 at various stages during the processes described in FIGS. 3-5.

Turning to FIG. 3, an example process 300 begins at block 302. The stage of fabrication following completion of block 302 of FIG. 3 is represented in FIG. 6. At block 302, the substrate 200 is provided As shown in FIG. 6, the substrate 200 includes the surface 214.

The stage of fabrication following completion of block 304 of FIG. 3 is represented in FIG. 7. At block 304, the conductive layer 204 is deposited on the substrate 200. In particular, the metal seed layer 202 and the conductive layer 204 are deposited on the substrate 200.

Figures 8, 9:
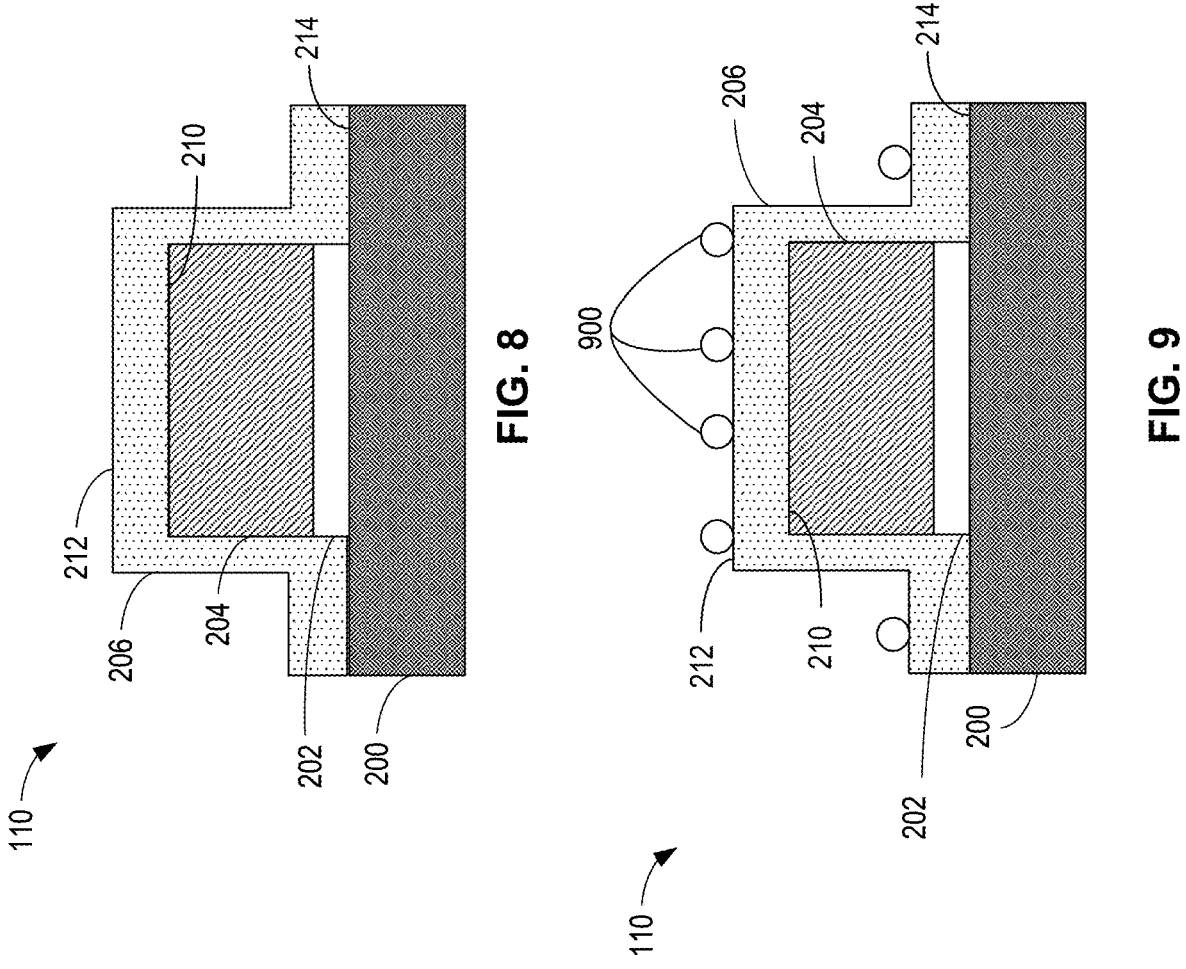

The stage of fabrication following completion of block 306 of FIG. 3 is represented in FIG. 8. At block 306, the nonconductive adhesion layer 206 is deposited on the conductive layer 204. In some examples, the nonconductive adhesion layer 206 is also deposited across exposed portions of the surface 214 of the substrate 200. As shown in FIG. 8, the nonconductive adhesion layer 206 includes the first and second surfaces 210, 212. To that end, the first surface 210 faces towards the surface 214 and the second surface 212 faces away from the surface 214.

Figures 10, 11:
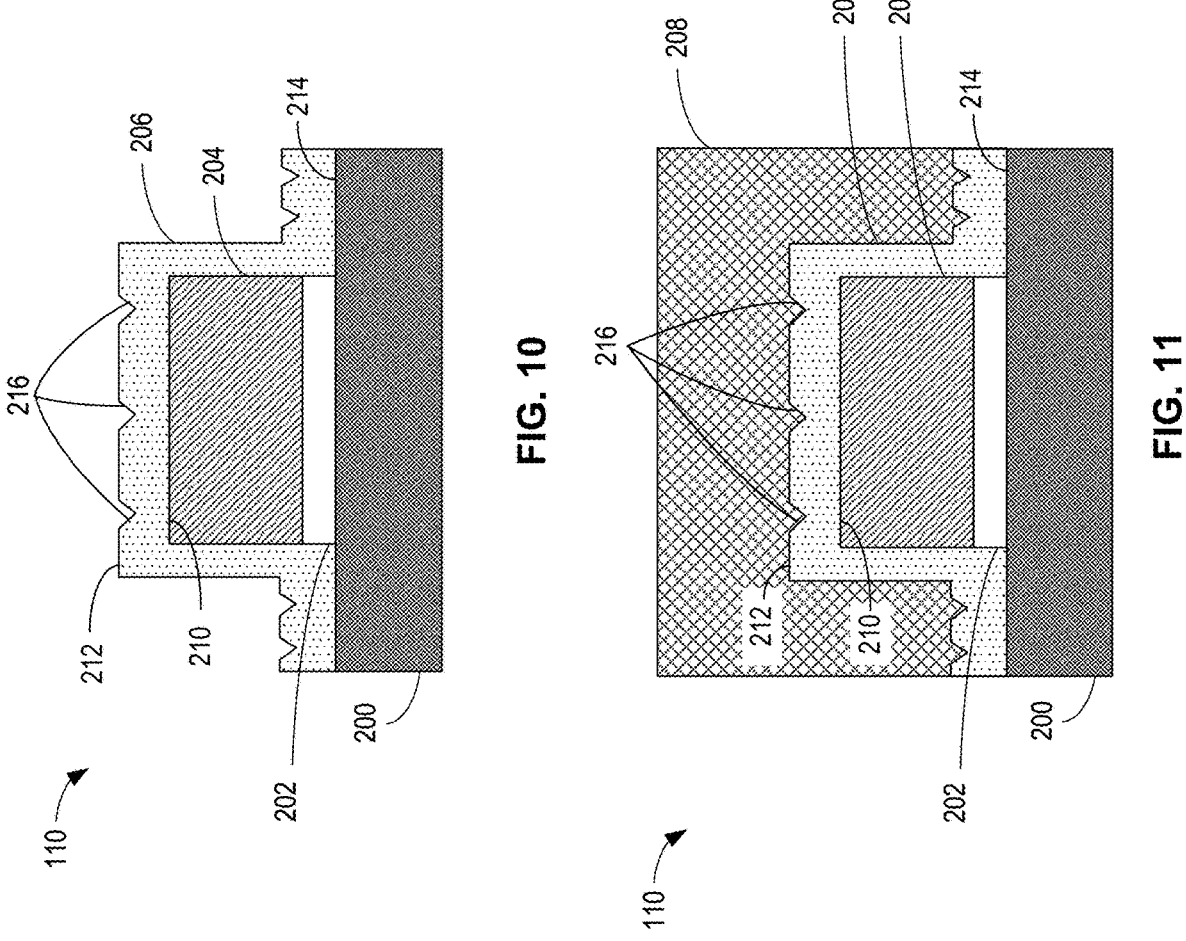
Figures 12, 13:
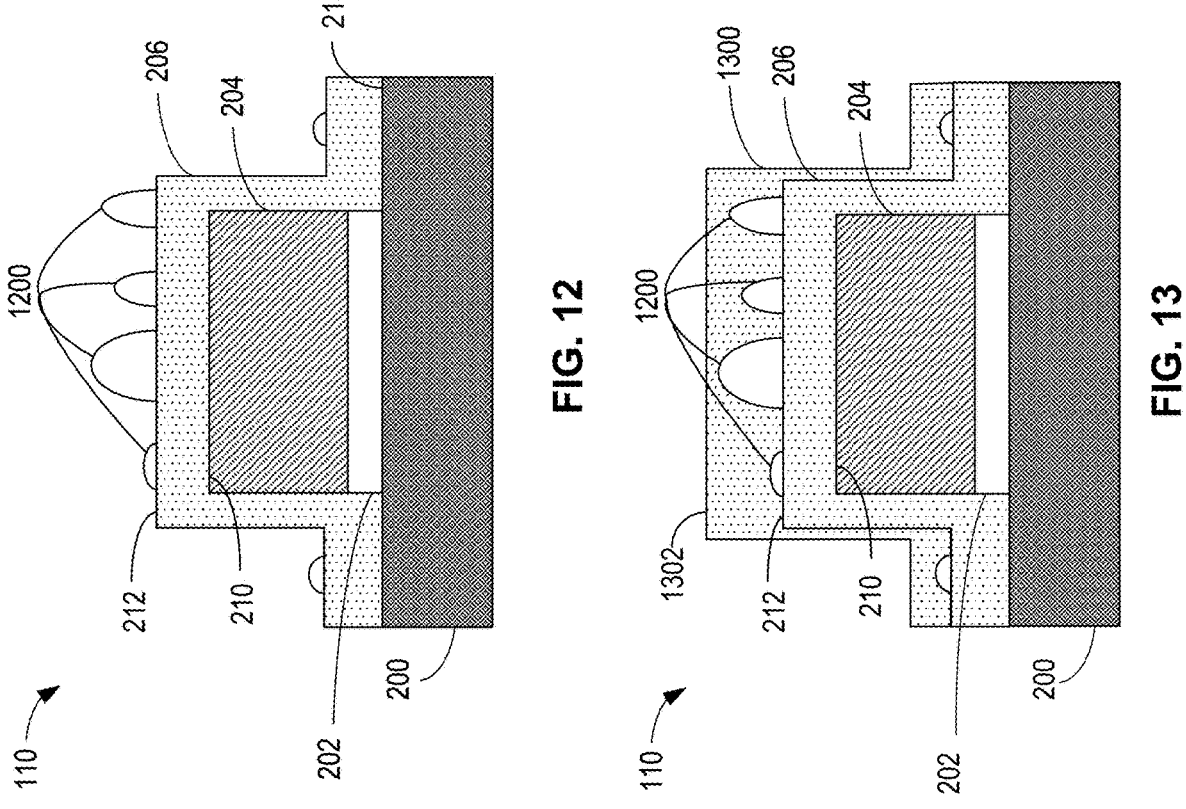
FIGS. 12-15 depict another example implementation of the example substrate of FIGS. 1 and 2 at various manufacturing stages corresponding to the example methods of FIGS. 3 and 5.
Figures 14, 15:
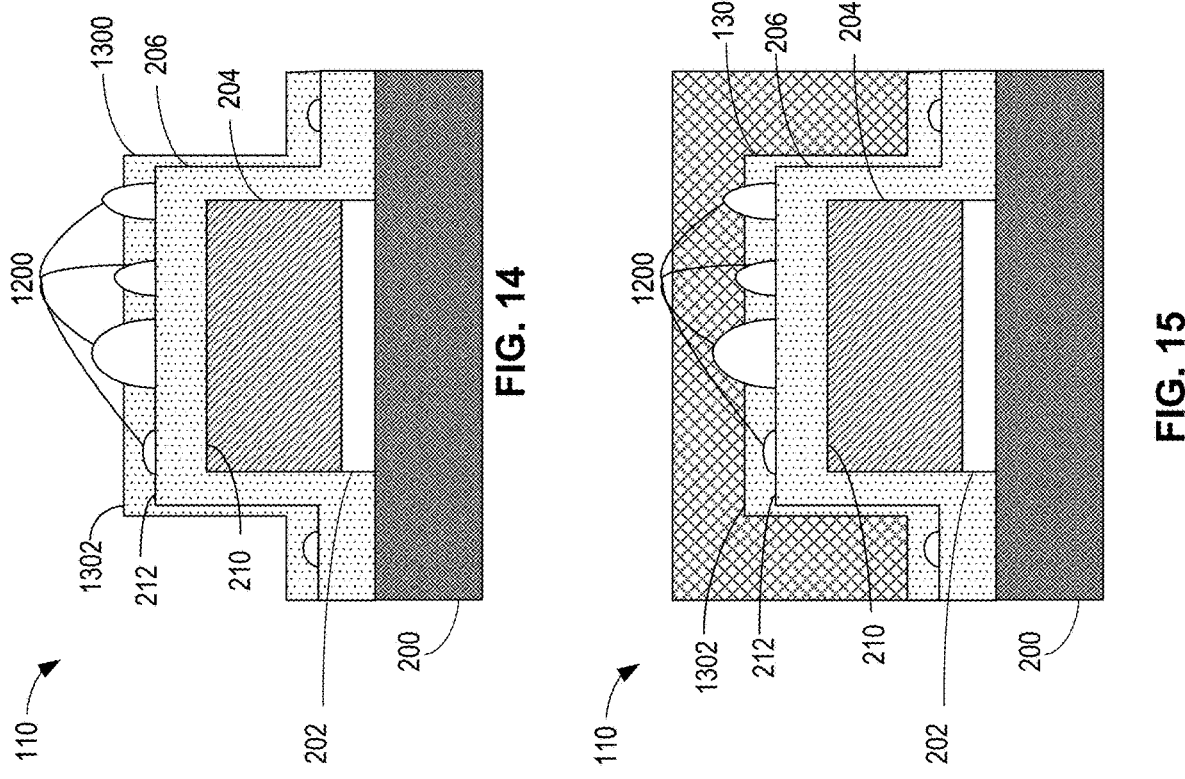

The stage of fabrication following completion of block 308 of FIG. 3, in a first example implementation, is represented in FIG. 10 with FIG. 9 representing an intermediate stage of fabrication in a first example subprocess for the first example implementation detailed in connection with the flowchart of FIG. 4. Alternatively, the stage of fabrication following completion of block 308 of FIG. 3, in a second example implementation, is represented in FIG. 14 with FIGS. 12 and 13 representing intermediate stages of fabrication in a second subprocess detailed in connection with the flowchart of FIG. 5. At block 308, an exposed surface (e.g., the surface 212) of the nonconductive adhesion layer 206 is roughened. In some examples, the surface roughening is accomplished through one or more processes including selective dry etching, plasma etching, multi-target sputtering, etc.

The stage of fabrication following completion of block 310 of FIG. 3 is represented in FIG. 11 in connection with the first example implementation (associated with the subprocess of FIG. 4) and/or FIG. 15 in connection with the second example implementation (associated with the subprocess of FIG. 5). At block 310, the dielectric layer 208 is attached to (e.g., added over, deposited on, laminated on, etc.) the conductive layer 204 via the nonconductive adhesion layer 206. As shown in FIG. 11, the dielectric layer 208 is attached to the nonconductive adhesion layer 206, wherein the nonconductive adhesion layer 206 includes the surface 212 (e.g., the roughened surface 212). As shown in FIG. 15, the dielectric layer 208 is attached to the nonconductive adhesion layer 206 that has been expanded with additional nonconductive adhesion material 1300 (FIG. 13), wherein the nonconductive adhesion layer 206 includes metal particulates 1200 extending through the additional nonconductive adhesion material 1300 (FIG. 15). At block 312, it is determined whether to add another conductive layer. If another conductive layer is to be added (block 312), the process returns to block 304. Otherwise, the example process of FIG. 3 ends and the final assembly may then proceed to additional fabrication processes as appropriate for the particular application in which the IC package 100 is to be implemented.

As noted above, FIG. 4 is a flowchart representative of a first example implementation of block 308 of FIG. 3. The example process of FIG. 4 begins at block 400. The stage of fabrication following completion of block 400 of FIG. 4 is represented in FIG. 9. At block 400, metal particulates (e.g., metal, titanium, magnesium) 900 are deposited onto the surface 212 of the nonconductive adhesion layer 206. In some examples, the metal particulates (e.g., metal bodies) 900 are distributed across the surface 212 by sputtering metal onto the surface 212. However, the amount of metal sputtered onto the surface is controlled to be insufficient to completely cover the surface 212 of the nonconductive adhesion layer 206. In some examples, the sputtered metal covers less than 50% of the surface 212. In some examples, the sputtered metal covers a smaller portion (e.g., less than 40%, less than 25%, less than 10%). Sputtering metal onto the surface 212 of the nonconductive adhesion layer 206 produces randomly located regions or islands of metal that define the metal particulates 900. In this example, the regions are spaced apart from one another such that portions of the nonconductive adhesion layer 206 remain uncovered and exposed.

The stage of fabrication following completion of block 402 of FIG. 4 is not directly represented in the figures but can be understood with reference to FIG. 10, which represents completion of both block 402 and 404. At block 402, the surface 212 of the nonconductive adhesion layer 206 (e.g., including the metal particulates 900 deposited thereon) is etched. In some examples, a dry etch process is employed. Due to the characteristics of the metal particulates 900, the metal particulates 900 act as a mask to enable the uneven etching of the nonconductive adhesion layer 206 with the uncovered or exposed portions of nonconductive adhesion layer 206 being etched away while the regions covered by the metal particulates 900 are protected from the etching process. As a result, the recesses 216 (e.g., crevices, cavities, openings, or valleys associated with a roughened surface) are produced in the nonconductive adhesion layer 206. The recesses 216 are etched into the nonconductive adhesion layer 206 such that the recesses 216 can at least partially surround regions of the nonconductive adhesion layer 206 in contact with the metal particulates 900. In some examples, the metal particulates 900 have different sizes (e.g., width in a range from 1 nm to 10 nm) and different spacing (e.g., distance between one another) across the surface 212. As such, the recesses 216 can vary in size corresponding to the different spacing of the different ones of the metal particulates 900. In this example, selectively etching the nonconductive adhesion layer 206 (using the metal particulates 900 as a mask) to produce the recesses 216 increases a roughness of an exposed surface (e.g., the surface 212) of the nonconductive adhesion layer 206. At block 404, the metal particulates 900 are removed (e.g., etched) from the surface 212. In some examples, removing at least some of the metal 900 is accomplished during the etching of the recesses 216 (block 402). That is, in some examples, blocks 402 and 404 correspond to the same fabrication process. In other examples, a separate process is employed to remove the metal particulates 900 after the etching process. In other examples, some or all of the metal particulates 900 can remain on the surface 212 after the etching process (block 402). That is, in some examples, block 404 is omitted. Thereafter, the example process of FIG. 4 ends and returns to complete the process of FIG. 3.

As noted above, FIG. 5 is a flowchart representative of a second example implementation of block 308 of FIG. 3. The example process of FIG. 5 begins at block 500. The stage of fabrication following completion of block 500 is represented at FIG. 12. At block 500, metal particulates (e.g., metal bodies) 1200 are deposited onto the surface 212 of the nonconductive adhesion layer 206. In some examples, the metal particulates 1200 are randomly distributed across the surface 212 of the nonconductive adhesion layer 206 using a sputtering process similar to that described above in connection with FIG. 4. In some examples, as represented in FIG. 12, different ones of the metal particulates 1200 have different heights. In some examples, the metal particulates 1200 constitute (e.g., correspond to) less than 5 atomic percent of the nonconductive adhesion layer 206 (e.g., the nonconductive adhesion layers 206, 1200). In some examples, the metal particulates 1200 can correspond to at least 1 atomic percent of the nonconductive adhesion layer 206. In some examples, ones of the metal particulates 1200 can have different sizes (e.g., different widths in a range from 1 nm to 10 nm). Additionally or alternatively, the metal particulates 1200 can have a generally hemispherical shape.

The stage of fabrication following completion of block 502 is represented in FIG. 13. At block 502, the additional nonconductive adhesion material 1300 (e.g., an additional nonconductive layer) is deposited onto the underlying nonconductive adhesion layer 206 (e.g., underlying portion of the nonconductive adhesion layer 206) to expand the nonconductive adhesion layer 206 and embed the metal particulates 1200 therein. As shown in FIG. 13, the additional nonconductive adhesion material 1300 encloses (e.g., embeds) the metal particulates 1200 between the nonconductive adhesion layer 206 and the additional nonconductive adhesion material 1300. In this example, the additional nonconductive adhesion material 1300 includes a surface 1302 facing away from the surface 212. In some examples, the metal particulates 1200 are positioned within the nonconductive adhesion layer 206 closer to the surface 1302 of the additional nonconductive adhesion material 1300 than to the surface 210 of the underlying nonconductive adhesion layer 206. That is, in some examples, the underlying nonconductive adhesion layer 206 is thicker than the additional nonconductive adhesion material 1300.

The stage of fabrication following completion of block 504 is represented in FIG. 14. At block 504, the additional nonconductive adhesion material 1300 is etched to partially uncover the metal particulates 1200. That is, an etching process begins at the surface 1302 of the additional nonconductive adhesion material 1300 and continues past upper extremities of at least one of the metal particulates 1200. In particular, the etching process described in the example of FIG. 14 removes a portion of the additional nonconductive adhesion material 1300 such that first ones of the metal particulates 1200 (e.g., the larger metal particulates having taller heights) protrude from (e.g., extend beyond) the surface 1302 and second ones of the metal particulates 1200 (e.g., the smaller metal particulates having shorter heights) are completely embedded or encased in the additional nonconductive adhesion material 1300. Due to the metal particulates 1200 extending beyond or protruding from the surface 1302 of the additional nonconductive adhesion material 1300, the surface 1302 is roughened by the metal particulates 1200, thereby increasing the surface roughness of the surface 1302. That is, the protruding portions pf the metal particulates 1200 correspond to the peaks of the roughened surface while the upper surface of the additional nonconductive adhesion material 1200 after the etching corresponds to the valleys of the roughened surface. Thereafter, the example process of FIG. 5 ends and returns to complete the process of FIG. 3 as discussed above.

Although example methods of implementing block 308 of FIG. 3 are described with reference to the flowcharts illustrated in FIGS. 4 and 5, many other methods may alternatively be used. For example, the order of execution of the blocks may be changed, and/or some of the blocks described may be combined, divided, rearranged, omitted, eliminated, and/or implemented in any other way. More particularly, in some examples, the metal particulates 900, 1200 may remain on the surface 212 of the nonconductive adhesion layer 206. Whereas, in some examples, the metal particulates 900, 1200 are removed (e.g., etched) from the surface 212. Further, in some examples, the additional nonconductive adhesion material 1300 can be omitted from the process of FIG. 5.

Figure 16:
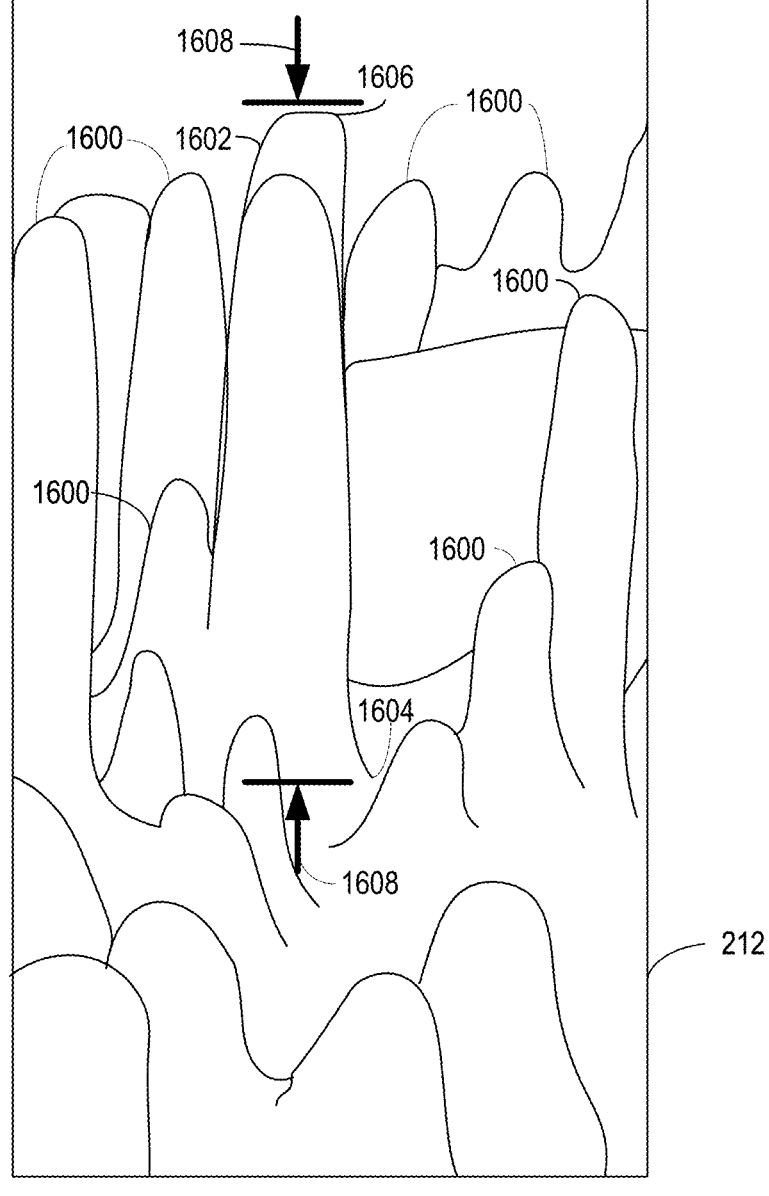
FIG. 16 is a detailed view of a portion of an example surface of the example substrate of FIGS. 1, 2, and/or 6-11.

FIG. 16 is a detailed view of a portion of the example surface 212 of the nonconductive adhesion layer 206 of FIG. 2. In this example, the surface 212 is characterized by a random distribution of pillars, whiskers, or protrusions 1600 extending from an underlying main body or mass of the nonconductive adhesion layer 206. The surface roughening techniques described herein can create the example protrusions 1600 on a surface of a nonconductive layer in the example substrate 110. More particularly, the location of the protrusions 1600 generally correspond to the location of the metal particulates 900. That is, as described above, the metal particulates 900 act as a mask such that the regions of the nonconductive adhesion layer 206 that are not covered by the metal particulates 900 are etched away such that what remains are the protrusions 1600 with the metal particulates positioned at or near the tips or ends of the protrusions 1600. In some examples, the protrusions 1600 can be used in a peak-to-valley roughness measurement to quantify a surface roughness of the surface 212. For example, a first one 1602 of the protrusions 1600 includes a valley 1604 at a location on the surface 212 and a peak 1606 at a location extending from the surface 212. Accordingly, a distance between the peak 1606 and the valley 1604 (as generally indicated by arrows 1608) can define the peak-to-valley measurement and, thus, the surface roughness of the surface 212. As noted above, in some examples, the peak-to-valley distance, as illustrated by the arrows 1608, is at least 75 nm and may be as high as 300 nm or more. In some examples, at least one of the protrusions 1600 can include the metal particulates 900. In some examples, the protrusions 1600 can correspond to the metal particulates 1200 that are partially embedded in but extend beyond the nonconductive adhesion layer 206, as discussed above in connection with FIGS. 12-15. The protrusions 1600 can have different widths corresponding to the different sizes of the different ones of the metal particulates 900, 1200. Further, the spacing or density of the protrusions generally corresponds to the spacing or density of the metal particulates 900, 1200. The protrusions 1600 can increase a surface area of the surface 212. Thus, the protrusions 1600 provide additional points of contact for the dielectric layer 208 (FIG. 2) to adhere to the nonconductive adhesion layer 206 (FIG. 2). That is, in some examples, the dielectric layer 208 (FIG. 2) interfaces with (e.g., contacts) sidewalls of the protrusions 1600.

The example IC package 100 of FIG. 1 disclosed herein, including the package substrate 110 as detailed in FIGS. 2-16, may be included in any suitable electronic component. FIGS. 17-20 illustrate various example of apparatus that may include or be included in the IC package 100 disclosed herein.

Figure 17:
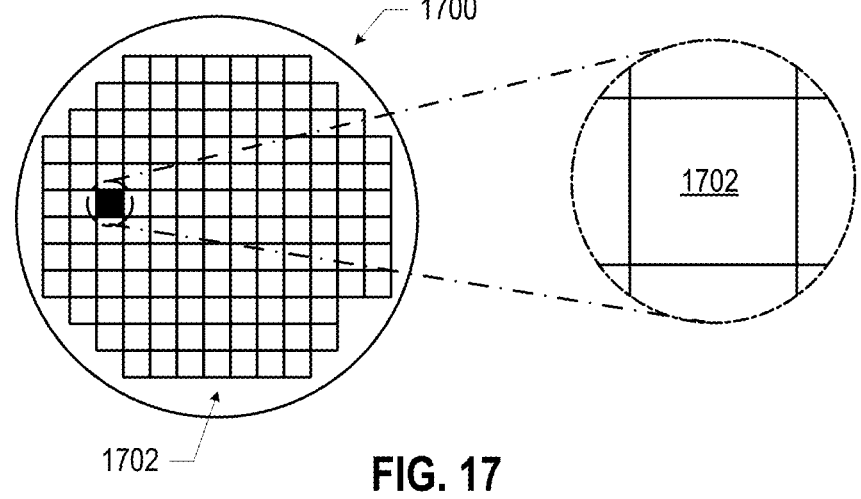
FIG. 17 is a wafer and dies that may be included in the example substrate of FIGS. 1, 2, 6-11, and/or 12-15 and/or the associated package of FIG. 1 constructed in accordance with teachings disclosed herein.

FIG. 17 is a top view of a wafer 1700 and dies 1702 that may be included in the IC package 100 of FIG. 1 (e.g., as any suitable ones of the dies 106, 108). The wafer 1700 may be composed of semiconductor material and may include one or more dies 1702 having IC structures formed on a surface of the wafer 1700. Each of the dies 1702 may be a repeating unit of a semiconductor product that includes any suitable IC. After the fabrication of the semiconductor product is complete, the wafer 1700 may undergo a singulation process in which the dies 1702 are separated from one another to provide discrete "chips" of the semiconductor product. The die 1702 may include one or more transistors (e.g., some of the transistors 1840 of FIG. 18, discussed below), support-ing circuitry to route electrical signals to the transistors, passive components (e.g., signal traces, resistors, capacitors, or inductors), and/or any other IC components. In some examples, the wafer 1700 or the die 1702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1702. For example, a memory array formed by multiple memory devices may be formed on a same die 1702 as processor circuitry (e.g., the processor circuitry 2002 of FIG. 20) or other logic that is configured to store information in the memory devices or execute instructions stored in the memory array.

Figure 18:
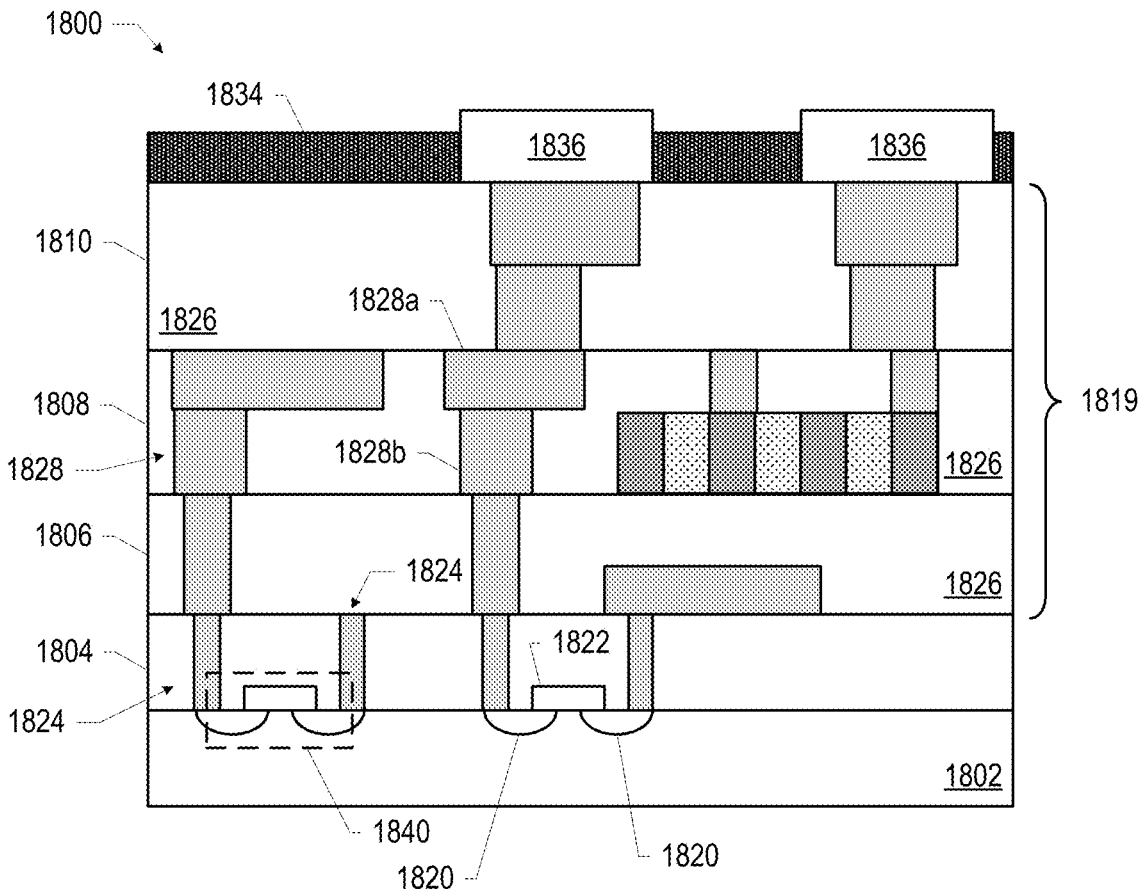
FIG. 18 is a cross-sectional side view of an IC device that may be included in the example substrate of FIGS. 1, 2, 6-11, and/or 12-15 and/or the associated package of FIG. 1 constructed in accordance with teachings disclosed herein.

FIG. 18 is a cross-sectional side view of an IC device 1800 that may be included in the example IC package 100. One or more of the IC devices 1800 may be included in one or more dies 1702 (FIG. 17). The IC device 1800 may be formed on a die substrate 1802 (e.g., the wafer 1700 of FIG. 17) and may be included in a die (e.g., the die 1702 of FIG. 17). The die substrate 1802 may be a semiconductor sub-strate composed of semiconductor material systems includ-ing, for example, n-type or p-type materials systems (or a combination of both). The die substrate 1802 may include, for example, a crystalline substrate formed using a bulk silicon or a silicon-on-insulator (SOI) substructure. In some examples, the die substrate 1802 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 1802. Although a few examples of materials from which the die substrate 1802 may be formed are described here, any material that may serve as a foundation for an IC device 1800 may be used. The die substrate 1802 may be part of a singulated die (e.g., the dies 1702 of FIG. 17) or a wafer (e.g., the wafer 1700 of FIG. 17).

The IC device 1800 may include one or more device layers 1804 disposed on the die substrate 1802. The device layer 1804 may include features of one or more transistors 1840 (e.g., metal oxide semiconductor field-effect transistors (MOSFETs)) formed on the die substrate 1802. The device layer 1804 may include, for example, one or more source and/or drain (S/D) regions 1820, a gate 1822 to control current flow in the transistors 1840 between the S/D regions 1820, and one or more S/D contacts 1824 to route electrical signals to/from the S/D regions 1820. The transistors 1840 may include additional features not depicted for the sake of clarity, such as device isolation regions, gate contacts, and the like. The transistors 1840 are not limited to the type and configuration depicted in FIG. 18 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transis-tors, such as nanoribbon and nanowire transistors.

Each transistor 1840 may include a gate 1822 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirco-nium silicon oxide, tantalum oxide, titanium oxide, barium strontium titanium oxide, barium titanium oxide, strontium titanium oxide, yttrium oxide, aluminum oxide, lead scan-dium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 1840 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palla-dium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 1840 along the source-channel-drain direction, the gate electrode may consist of a U-shaped structure that includes a bottom portion substantially parallel to the sur-face of the die substrate 1802 and two sidewall portions that are substantially perpendicular to the top surface of the die substrate 1802. In other examples, at least one of the metal layers that form the gate electrode may simply be a planar layer that is substantially parallel to the top surface of the die substrate 1802 and does not include sidewall portions substantially perpendicular to the top surface of the die substrate 1802. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 1820 may be formed within the die substrate 1802 adjacent to the gate 1822 of each transistor 1840. The S/D regions 1820 may be formed using an implantation/diffusion process or an etching/deposition process, for example. In the former process, dopants such as boron, aluminum, antimony, phosphorous, or arsenic may be ion-implanted into the die substrate 1802 to form the S/D regions 1820. An annealing process that activates the dopants and causes them to diffuse farther into the die substrate 1802 may follow the ion-implantation process. In the latter process, the die substrate 1802 may first be etched to form recesses at the locations of the S/D regions 1820. An epitaxial deposition process may then be carried out to fill the recesses with material that is used to fabricate the S/D regions 1820. In some implementations, the S/D regions 1820 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 1820 may be formed using one or more alternate semiconductor materials such as germanium or a group III-V material or alloy. In further examples, one or more layers of metal and/or metal alloys may be used to form the S/D regions 1820.

Electrical signals, such as power and/or input/output (I/O) signals, may be routed to and/or from the devices (e.g., transistors 1840) of the device layer 1804 through one or more interconnect layers disposed on the device layer 1804 (illustrated in FIG. 18 as interconnect layers 1806-1810). For example, electrically conductive features of the device layer 1804 (e.g., the gate 1822 and the S/D contacts 1824) may be electrically coupled with the interconnect structures 1828 of the interconnect layers 1806-1810. The one or more interconnect layers 1806-1810 may form a metallization stack (also referred to as an "ILD stack") 1819 of the IC device 1800.

The interconnect structures 1828 may be arranged within the interconnect layers 1806-1810 to route electrical signals according to a wide variety of designs (in particular, the arrangement is not limited to the particular configuration of interconnect structures 1828 depicted in FIG. 18). Although a particular number of interconnect layers 1806-1810 is depicted in FIG. 18, examples of the present disclosure include IC devices having more or fewer interconnect layers than depicted.

In some examples, the interconnect structures 1828 may include lines 1828a and/or vias 1828b filled with an electrically conductive material such as a metal. The lines 1828a may be arranged to route electrical signals in a direction of a plane that is substantially parallel with a surface of the die substrate 1802 upon which the device layer 1804 is formed. For example, the lines 1828a may route electrical signals in a direction in and out of the page from the perspective of FIG. 18. The vias 1828b may be arranged to route electrical signals in a direction of a plane that is substantially perpendicular to the surface of the die substrate 1802 upon which the device layer 1804 is formed. In some examples, the vias 1828b may electrically couple lines 1828a of different interconnect layers 1806-1810 together.

The interconnect layers 1806-2010 may include a dielectric material 1826 disposed between the interconnect structures 1828, as shown in FIG. 18. In some examples, the dielectric material 1826 disposed between the interconnect structures 1828 in different ones of the interconnect layers 1806-1810 may have different compositions; in other examples, the composition of the dielectric material 1826 between different interconnect layers 1806-1810 may be the same.

A first interconnect layer 1806 (referred to as Metal 1 or "M1") may be formed directly on the device layer 1804. In some examples, the first interconnect layer 1806 may include lines 1828a and/or vias 1828b, as shown. The lines 1828a of the first interconnect layer 1806 may be coupled with contacts (e.g., the S/D contacts 1824) of the device layer 1804.

A second interconnect layer 1808 (referred to as Metal 2 or "M2") may be formed directly on the first interconnect layer 1806. In some examples, the second interconnect layer 1808 may include vias 1828b to couple the lines 1828a of the second interconnect layer 1808 with the lines 1828a of the first interconnect layer 1806. Although the lines 1828a and the vias 1828b are structurally delineated with a line within each interconnect layer (e.g., within the second interconnect layer 1808) for the sake of clarity, the lines 1828a and the vias 1828b may be structurally and/or materially contiguous (e.g., simultaneously filled during a dual-damascene process) in some examples.

A third interconnect layer 1810 (referred to as Metal 3 or "M3") (and additional interconnect layers, as desired) may be formed in succession on the second interconnect layer 1808 according to similar techniques and configurations described in connection with the second interconnect layer 1808 or the first interconnect layer 1806. In some examples, the interconnect layers that are "higher up" in the metallization stack 1819 in the IC device 1800 (i.e., further away from the device layer 1804) may be thicker.

The IC device 1800 may include a solder resist material 1834 (e.g., polyimide or similar material) and one or more conductive contacts 1836 formed on the interconnect layers 1806-1810. In FIG. 18, the conductive contacts 1836 are illustrated as taking the form of bonding pads. The conductive contacts 1836 may be electrically coupled with the interconnect structures 1828 and configured to route the electrical signals of the transistor(s) 1840 to other external devices. For example, solder bonds may be formed on the one or more conductive contacts 1836 to mechanically and/or electrically couple a chip including the IC device 1800 with another component (e.g., a circuit board). The IC device 1800 may include additional or alternate structures to route the electrical signals from the interconnect layers 1806-1810; for example, the conductive contacts 1836 may include other analogous features (e.g., posts) that route the electrical signals to external components.

Figures 19, 20:
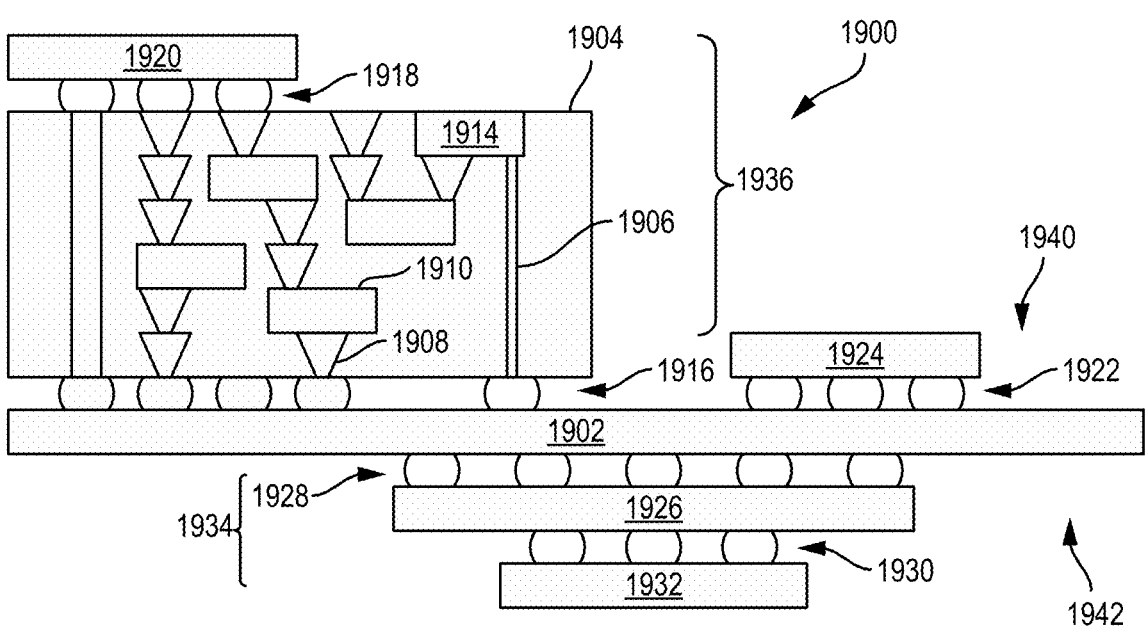
FIG. 19 is a cross-sectional side view of an IC device assembly that may include the example substrate of FIGS. 1, 2, 6-11, and/or 12-15 and/or the associated package of FIG. 1 constructed in accordance with teachings disclosed herein.
FIG. 20 is a block diagram of an example electrical device that may include the example substrate of FIGS. 1, 2, 6-11, and/or 12-15 and/or the associated package of FIG. 1 constructed in accordance with teachings disclosed herein.

FIG. 19 is a cross-sectional side view of an IC device assembly 1900 that may include the IC package 100 disclosed herein. In some examples, the IC device assembly corresponds to the IC package 100. The IC device assembly 1900 includes a number of components disposed on a circuit board 1902 (which may be, for example, a motherboard). The IC device assembly 1900 includes components disposed on a first face 1940 of the circuit board 1902 and an opposing second face 1942 of the circuit board 1902; generally, components may be disposed on one or both faces 1940 and 1942. Any of the IC packages discussed below with reference to the IC device assembly 1900 may take the form of the example IC package 100 of FIG. 1.

In some examples, the circuit board 1902 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1902. In other examples, the circuit board 1902 may be a non-PCB substrate. In some examples, the circuit board 1902 may be, for example, the circuit board 102 of FIG. 1.

The IC device assembly 1900 illustrated in FIG. 19 includes a package-on-interposer structure 1936 coupled to the first face 1940 of the circuit board 1902 by coupling components 1916. The coupling components 1916 may electrically and mechanically couple the package-on-interposer structure 1936 to the circuit board 1902, and may include solder balls (as shown in FIG. 19), male and female portions of a socket, an adhesive, an underfill material, and/or any other suitable electrical and/or mechanical coupling structure.

The package-on-interposer structure 1936 may include an IC package 1920 coupled to an interposer 1904 by coupling components 1918. The coupling components 1918 may take any suitable form for the application, such as the forms discussed above with reference to the coupling components 1916. Although a single IC package 1920 is shown in FIG. 19, multiple IC packages may be coupled to the interposer 1904; indeed, additional interposers may be coupled to the interposer 1904. The interposer 1904 may provide an intervening substrate used to bridge the circuit board 1902 and the IC package 1920. The IC package 1920 may be or include, for example, a die (the die 1702 of FIG. 17), an IC device (e.g., the IC device 1800 of FIG. 18), or any other suitable component. Generally, the interposer 1904 may spread a connection to a wider pitch or reroute a connection to a different connection. For example, the interposer 1904 may couple the IC package 1920 (e.g., a die) to a set of BGA conductive contacts of the coupling components 1916 for coupling to the circuit board 1902. In the example illustrated in FIG. 19, the IC package 1920 and the circuit board 1902 are attached to opposing sides of the interposer 1904; in other examples, the IC package 1920 and the circuit board 1902 may be attached to a same side of the interposer 1904. In some examples, three or more components may be interconnected by way of the interposer 1904.

In some examples, the interposer 1904 may be formed as a PCB, including multiple metal layers separated from one another by layers of dielectric material and interconnected by electrically conductive vias. In some examples, the interposer 1904 may be formed of an epoxy resin, a fiberglass-reinforced epoxy resin, an epoxy resin with inorganic fillers, a ceramic material, or a polymer material such as polyimide. In some examples, the interposer 1904 may be formed of alternate rigid or flexible materials that may include the same materials described above for use in a semiconductor substrate, such as silicon, germanium, and other group III-V and group IV materials. The interposer 1904 may include metal interconnects 1908 and vias 1910, including but not limited to through-silicon vias (TSVs) 1906. The interposer 1904 may further include embedded devices 1914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1904. The package-on-interposer structure 1936 may take the form of any of the package-on-interposer structures known in the art.

The IC device assembly 1900 may include an IC package 1918 coupled to the first face 1940 of the circuit board 1902 by coupling components 1922. The coupling components 1922 may take the form of any of the examples discussed above with reference to the coupling components 1916, and the IC package 1924 may take the form of any of the examples discussed above with reference to the IC package 1920.

The IC device assembly 1900 illustrated in FIG. 19 includes a package-on-package structure 1934 coupled to the second face 1942 of the circuit board 1902 by coupling components 1928. The package-on-package structure 1934 may include a first IC package 1926 and a second IC package 1932 coupled together by coupling components 1930 such that the first IC package 1926 is disposed between the circuit board 1902 and the second IC package 1932. The coupling components 1928, 1930 may take the form of any of the examples of the coupling components 1916 discussed above, and the IC packages 1926, 1932 may take the form of any of the examples of the IC package 1920 discussed above. The package-on-package structure 1934 may be configured in accordance with any of the package-on-package structures known in the art.

FIG. 20 is a block diagram of an example electrical device 2000 that may include one or more of the example IC packages 100 of FIG. 1. For example, any suitable ones of the components of the electrical device 2000 may include one or more of the device assemblies 1900, IC devices 1800, or dies 1702 disclosed herein, and may be arranged in the example IC package 100. A number of components are illustrated in FIG. 20 as included in the electrical device 2000, but any one or more of these components may be omitted or duplicated, as suitable for the application. In some examples, some or all of the components included in the electrical device 2000 may be attached to one or more motherboards. In some examples, some or all of these components are fabricated onto a single system-on-a-chip (SoC) die.

Additionally, in various examples, the electrical device 2000 may not include one or more of the components illustrated in FIG. 20, but the electrical device 2000 may include interface circuitry for coupling to the one or more components. For example, the electrical device 2000 may not include a display 2006, but may include display interface circuitry (e.g., a connector and driver circuitry) to which a display 2006 may be coupled. In another set of examples, the electrical device 2000 may not include an audio input device 2024 (e.g., microphone) or an audio output device 2008 (e.g., a speaker, headset, earbuds, etc.), but may include audio input or output device interface circuitry (e.g., connectors and supporting circuitry) to which an audio input device 2024 or audio output device 2008 may be coupled.

The electrical device 2000 may include processor circuitry 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processor circuitry 2002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processor circuitry. The electrical device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 2004 may include memory that shares a die with the processor circuitry 2002. This memory may be used as cache memory and may include embedded dynamic random access memory (eDRAM) or spin transfer torque magnetic random access memory (STT-MRAM).

In some examples, the electrical device 2000 may include a communication chip 2012 (e.g., one or more communication chips). For example, the communication chip 2012 may be configured for managing wireless communications for the transfer of data to and from the electrical device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other examples.

The electrical device 2000 may include an antenna 2022 to facilitate wireless communications and/or to receive other wireless communications (such as AM or FM radio transmissions).

In some examples, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some examples, a first communication chip 2012 may be dedicated to wireless communications, and a second communication chip 2012 may be dedicated to wired communications.

The electrical device 2000 may include battery/power circuitry 2014. The battery/power circuitry 2014 may include one or more energy storage devices (e.g., batteries or capacitors) and/or circuitry for coupling components of the electrical device 2000 to an energy source separate from the electrical device 2000 (e.g., AC line power).

The electrical device 2000 may include a display 2006 (or corresponding interface circuitry, as discussed above). The display 2006 may include any visual indicators, such as a heads-up display, a computer monitor, a projector, a touchscreen display, a liquid crystal display (LCD), a light-emitting diode display, or a flat panel display.

The electrical device 2000 may include an audio output device 2008 (or corresponding interface circuitry, as discussed above). The audio output device 2008 may include any device that generates an audible indicator, such as speakers, headsets, or earbuds.

The electrical device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The electrical device 2000 may include GPS circuitry 2018. The GPS circuitry 2018 may be in communication with a satellite-based system and may receive a location of the electrical device 2000, as known in the art.

The electrical device 2000 may include any other output device 2010 (or corresponding interface circuitry, as discussed above). Examples of the other output device 2010 may include an audio codec, a video codec, a printer, a wired or wireless transmitter for providing information to other devices, or an additional storage device.

The electrical device 2000 may include any other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader. The electrical device 2000 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 2000 may be any other electronic device that processes data.

From the foregoing, it will be appreciated that example systems, methods, apparatus, and articles of manufacture have been disclosed that provide an improved technique to adhere (e.g., bond) a conductive layer (e.g., copper) to a dielectric layer through the use of an intermediary nonconductive adhesion layer (e.g., an adhesion promoting layer). Examples disclosed herein utilize an intermediary nonconductive adhesion layer for improved electrical isolation in semiconductor devices. Further, the use of an intermediary nonconductive adhesion layer in disclosed examples enable smooth (non-roughened) surfaces on the underlying conductive layer for improved electrical performance. Examples disclosed herein reduce the adverse effects of delamination between nonconductive and conductive layers in semiconductor devices. Examples disclosed herein utilize surface roughening techniques for improved adhesion between nonconductive layers of an electronic circuit device (e.g., between an intermediary nonconductive adhesion layer and a subsequently added dielectric layer). Disclosed systems, methods, apparatus, and articles of manufacture are accordingly directed to one or more improvement(s) in the operation of a machine such as a computer or other electronic and/or mechanical device.

Example 1 includes an apparatus comprising an electrically conductive layer, a dielectric layer, and an electrically nonconductive layer separating the dielectric layer from the conductive layer, the nonconductive layer having a first surface facing the conductive layer and a second surface facing the dielectric layer, the first surface having a first roughness, the second surface having a second roughness greater than the first roughness.

Example 2 includes the apparatus of example 1, wherein the electrically nonconductive layer includes silicon and nitrogen.

Example 3 includes the apparatus of any one of examples 1 or 2, wherein the second roughness corresponds to a surface roughness greater than 75 nanometers (nm).

Example 4 includes the apparatus of any one of examples 1-3, wherein the second surface defines an interface between the nonconductive layer and the dielectric layer such that the nonconductive layer is in contact with the dielectric layer.

Example 5 includes the apparatus of example 4, further including metal particulates at the interface between the nonconductive layer and the dielectric layer.

Example 6 includes the apparatus of example 5, wherein ones of the metal particulates have a width in a range from 1 nm to 10 nm.

Example 7 includes the apparatus of any one of examples 5 or 6, wherein the second surface of the nonconductive layer includes recesses at least partially surrounding regions of the nonconductive layer in contact with the metal particulates.

Example 8 includes the apparatus of example 5, wherein the metal particulates include at least one of titanium or magnesium.

Example 9 includes the apparatus of any one of examples 1-8, further including metal particulates embedded in the nonconductive layer, the second roughness based on ones of the metal particulates protruding beyond the second surface.

Example 10 includes the apparatus of example 9, wherein ones of the metal particulates are completely encased by the nonconductive layer.

Example 11 includes an integrated circuit (IC) package comprising a substrate, a conductive trace extending along a first surface of the substrate, a dielectric material covering the conductive trace and extending across the first surface of the substrate, and a nonconductive material between the conductive trace and the dielectric material, the nonconductive material having a second surface facing away from the first surface of the substrate, the second surface of the nonconductive material including protrusions extending from a main body of the nonconductive material, the dielectric material to interface with sidewalls of the protrusions.

Example 12 includes the IC package of example 11, wherein the nonconductive material further includes a third surface opposite the second surface, the second surface having a surface area greater than the third surface due to the protrusions on the second surface.

Example 13 includes the IC package of any one of examples 11 or 12, further including metal bodies at ends of ones of the protrusions.

Example 14 includes the IC package of example 13, wherein different ones of the metal bodies have different sizes.

Example 15 includes the IC package of example 14, wherein different ones of the protrusions have different widths corresponding to the different sizes of the different ones of the metal bodies.

Example 16 includes the IC package of any one of examples 13-15, wherein the metal bodies are at least one of irregularly or randomly distributed across the second surface of the nonconductive material.

Example 17 includes a method of manufacturing an integrated circuit (IC) package, the method comprising depositing a nonconductive layer onto a conductive layer, the conductive layer to define a conductive trace within the IC package, etching recesses into the nonconductive layer to increase a roughness of an exposed surface of the nonconductive layer, and attaching a dielectric layer to the roughened surface of the nonconductive layer.

Example 18 includes the method of example 17, further including depositing metal onto the nonconductive layer to produce randomly located regions of the metal on the nonconductive layer, different ones of the regions spaced apart from one another, the regions of metal to act as a mask to enable the etching of the recesses into the nonconductive layer.

Example 19 includes the method of example 18, further including removing at least some of the metal from the nonconductive layer before attaching the dielectric layer.

Example 20 includes the method of example 19, wherein the removing of the at least some of the metal is accomplished during the etching of the recesses into the nonconductive layer.

Example 21 includes the method of any one of examples 19 or 20, wherein the removing of the at least some of the metal is accomplished after the etching of the recesses into the nonconductive layer.

Example 22 includes the method of any one of examples 17-21, further including embedding bodies of metal into the nonconductive layer, the bodies of metal to block the etching of the nonconductive layer to enable formation of the recesses in the nonconductive layer.

Example 23 includes the method of example 22, wherein the embedding of the bodies of metal into the nonconductive layer is accomplished by adding additional nonconductive material over the bodies of metal deposited on an underlying portion of the nonconductive layer, the additional nonconductive material to enclose the bodies of metal.

Example 24 includes the method of any one of examples 22 or 23, wherein the bodies of metal are closer to the exposed surface of the nonconductive layer than to a second surface of the nonconductive layer, the second surface of the nonconductive layer adjacent the conductive layer.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus comprising:
an electrically conductive layer;
a dielectric layer; and
an electrically nonconductive layer separating the dielectric layer from the conductive layer, the nonconductive layer having a first surface facing the conductive layer and a second surface facing the dielectric layer, the first surface having a first roughness, the second surface having a second roughness greater than the first roughness.

2. The apparatus of claim 1, wherein the electrically nonconductive layer includes silicon and nitrogen.

3. The apparatus of claim 1, wherein the second roughness corresponds to a surface roughness greater than 75 nanometers (nm).

4. The apparatus of claim 1, wherein the second surface defines an interface between the nonconductive layer and the dielectric layer such that the nonconductive layer is in contact with the dielectric layer.

5. The apparatus of claim 4, further including metal particulates at the interface between the nonconductive layer and the dielectric layer.

6. The apparatus of claim 5, wherein ones of the metal particulates have a width in a range from 1 nm to 10 nm.

7. The apparatus of claim 5, wherein the second surface of the nonconductive layer includes recesses at least partially surrounding regions of the nonconductive layer in contact with the metal particulates.

8. The apparatus of claim 5, wherein the metal particulates include at least one of titanium or magnesium.

9. The apparatus of claim 1, further including metal particulates embedded in the nonconductive layer, the second roughness based on ones of the metal particulates protruding beyond the second surface.

10. The apparatus of claim 9, wherein ones of the metal particulates are completely encased by the nonconductive layer.

11. An integrated circuit (IC) package comprising:
a substrate;
a conductive trace extending along a first surface of the substrate;
a dielectric material covering the conductive trace and extending across the first surface of the substrate; and
a nonconductive material between the conductive trace and the dielectric material, the nonconductive material having a second surface facing away from the first surface of the substrate, the second surface of the nonconductive material including protrusions extending from a main body of the nonconductive material, the dielectric material to interface with sidewalls of the protrusions.

12. The IC package of claim 11, wherein the nonconductive material further includes a third surface opposite the second surface, the second surface having a surface area greater than the third surface due to the protrusions on the second surface.

13. The IC package of claim 11, further including metal bodies at ends of ones of the protrusions.

14. The IC package of claim 13, wherein different ones of the metal bodies have different sizes.

15. The IC package of claim 14, wherein different ones of the protrusions have different widths corresponding to the different sizes of the different ones of the metal bodies.

16. The IC package of claim 13, wherein the metal bodies are at least one of irregularly or randomly distributed across the second surface of the nonconductive material.

* * * * *